US010388755B1

United States Patent
Lee et al.

(10) Patent No.: US 10,388,755 B1
(45) Date of Patent: Aug. 20, 2019

(54) STACKED NANOSHEETS WITH SELF-ALIGNED INNER SPACERS AND METALLIC SOURCE/DRAIN

(71) Applicant: INTERNATIONAL BUSINESS MACHINES CORPORATION, Armonk, NY (US)

(72) Inventors: Choonghyun Lee, Rensselaer, NY (US); Kangguo Cheng, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/996,922

(22) Filed: Jun. 4, 2018

(51) Int. Cl.
| | | |
|---|---|---|
| *H01L 21/8234* | (2006.01) | |
| *H01L 29/66* | (2006.01) | |
| *H01L 21/28* | (2006.01) | |
| *H01L 29/78* | (2006.01) | |
| *H01L 29/16* | (2006.01) | |

(Continued)

(52) U.S. Cl.
CPC .. *H01L 29/66553* (2013.01); *H01L 21/02175* (2013.01); *H01L 21/2822* (2013.01); *H01L 21/28229* (2013.01); *H01L 21/28518* (2013.01); *H01L 21/30604* (2013.01); *H01L 21/31116* (2013.01); *H01L 29/0653* (2013.01); *H01L 29/16* (2013.01); *H01L 29/6653* (2013.01); *H01L 29/6681* (2013.01);
(Continued)

(58) Field of Classification Search
CPC ......... H01L 29/66553; H01L 29/66545; H01L 21/02175; H01L 21/31116; H01L 21/30604; H01L 21/28518; H01L 29/785; H01L 29/66575; H01L 29/6653; H01L 29/0653; H01L 29/6681; H01L 29/16; H01L 29/7833; H01L 21/28229; H01L 21/2822

See application file for complete search history.

(56) References Cited

U.S. PATENT DOCUMENTS

| 7,842,612 | B2 | 11/2010 | Nemouchi |
| 8,124,513 | B2 | 2/2012 | Lin |

(Continued)

OTHER PUBLICATIONS

C.H. Lee et al., Oxygen Potential Engineering of Interfacial Layer for Deep Sub-nm EOT High-k Gate Stacks on Ge, 2013 IEEE International Electron Devices Meeting, Washington, DC, Dec. 2013.

(Continued)

*Primary Examiner* — Thanh T Nguyen
(74) *Attorney, Agent, or Firm* — Tutunjian & Bitetto, P.C.; Vazken Alexanian

(57) ABSTRACT

Semiconductor devices and methods of forming the same include forming a stack of alternating channel layers and sacrificial layers. The sacrificial layers are recessed relative to the channel layers. A metal-doped insulator layer is in contact with sidewalls of the channel layers. The metal-doped insulator layer is annealed to form a metallic layer at an interface between the metal-doped insulator layer and the channel layers. The metal-doped insulator layer is etched back to form inner spacers. Source/drain regions are formed in contact with the metallic layer. The sacrificial layers are etched away and a gate stack is formed on and around the channel layers.

15 Claims, 8 Drawing Sheets

(51) Int. Cl.
    *H01L 29/06*     (2006.01)
    *H01L 21/285*     (2006.01)
    *H01L 21/306*     (2006.01)
    *H01L 21/311*     (2006.01)
    *H01L 21/02*     (2006.01)

(52) U.S. Cl.
    CPC .. *H01L 29/66545* (2013.01); *H01L 29/66575* (2013.01); *H01L 29/785* (2013.01); *H01L 29/7833* (2013.01)

(56) References Cited

U.S. PATENT DOCUMENTS

| | | | |
|---|---|---|---|
| 9,362,355 B1 * | 6/2016 | Cheng | H01L 29/66742 |
| 9,437,502 B1 | 9/2016 | Cheng et al. | |
| 9,620,590 B1 | 4/2017 | Bergendahl et al. | |
| 9,647,098 B2 | 5/2017 | Obradovic et al. | |
| 9,722,026 B2 | 8/2017 | Toriumi et al. | |
| 10,243,043 B2 * | 3/2019 | Mochizuki | H01L 29/0649 |
| 2013/0270512 A1 | 10/2013 | Radosavljevic et al. | |
| 2014/0339611 A1 | 11/2014 | Leobandung | |
| 2015/0372104 A1 * | 12/2015 | Liu | H01L 29/42364 257/77 |
| 2016/0020305 A1 * | 1/2016 | Obradovic | H01L 29/7391 257/39 |
| 2017/0221992 A1 | 8/2017 | Chang et al. | |
| 2017/0330934 A1 * | 11/2017 | Zhang | H01L 29/0665 |

OTHER PUBLICATIONS

C.H. Lee et al., Thermally Robust CMOS-aware Ge MOSFETs with High Mobility at High-carrier Densities on a Single Orientation Ge Substrate, 014 Symposium on VLSI Technology (VLSI-Technology): Digest of Technical Papers, Honolulu, HI, Jun. 2014.

Tomonori Nishimura et al., Evidence for strong Fermi-level pinning due to metal-induced gap states at metal/germanium interface, Applied Physics Letters 91, Sep. 2007.

* cited by examiner

STACKED NANOSHEETS WITH SELF-ALIGNED INNER SPACERS AND METALLIC SOURCE/DRAIN

BACKGROUND

Technical Field

The present invention generally relates to semiconductor device fabrication and, more particularly, to fabrication of germanium nanosheet field effect transistors with metallic source/drain structures.

Description of the Related Art

Nanosheet transistors make use of gate-all-around designs to increase interface area between the nanosheet channels and the gate conductor. However, parasitic capacitances can arise between the channels and the source/drain structures. To address this problem, inner spacers can be formed that diminish the parasitic capacitance. The formation of these structures in various semiconductor materials can be challenging. Furthermore, the volume of the source/drain structures from doped semiconductor materials using conventional epitaxial processes is limited by the contacted poly pitch, resulting in high source/drain contact resistance.

SUMMARY

A method for forming a semiconductor device includes forming a stack of alternating channel layers and sacrificial layers. The sacrificial layers are recessed relative to the channel layers. A metal-doped insulator layer is in contact with sidewalls of the channel layers. The metal-doped insulator layer is annealed to form a metallic layer at an interface between the metal-doped insulator layer and the channel layers. The metal-doped insulator layer is etched back to form inner spacers. Source/drain regions are formed in contact with the metallic layer. The sacrificial layers are etched away and a gate stack is formed on and around the channel layers.

A method for forming a semiconductor device includes forming a stack of alternating channel layers and sacrificial layers. The sacrificial layers are recessed relative to the channel layers. A metal-doped insulator layer is deposited in contact with sidewalls of the channel layers. The metal-doped insulator layer is annealed to form a metallic layer at an interface between the metal-doped insulator layer and the channel layers. The metal-doped insulator layer is etched away. A dielectric material is deposited after etching away the metal-doped insulator layer to form inner spacers. Source/drain regions are formed in contact with the metallic layer. The sacrificial layers are etched away and a gate stack is formed on and around the channel layers.

A semiconductor device includes vertically stacked channel layers formed from a semiconductor material. Inner spacers are positioned between vertically adjacent channel layers. Metal source/drain regions are formed. A metallic interface layer is between the metal source/drain regions and the vertically stacked channel layers. The metallic interface layer includes the semiconductor material and a metal. A gate stack is formed between and around the channel layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide germanium-channel, p-type field effect transistors (pFETs) using gate-all-around structures with self-aligned inner spacers and metallic source/drain regions. The use of germanium for pFET channels provides advantages over silicon in terms of hole mobility and the formation of metallic source/drain structures. Furthermore, germanium's low processing temperature makes it easier to integrate that material with high-k dielectric materials. To accomplish this, metal-doped germanium oxide is deposited and annealed, which reacts with the germanium channels to convert the dielectric oxide to a metallic material. The anneal converts the solid dielectric oxide to a volatile species (e.g., germanium monoxide), which desorbs, leaving behind a metallic germanide. This metallic interface provides a conductive contact for the formation of metal source/drain structures, which can help to reduce source/drain contact resistance as compared to source/drain structures formed by epitaxy.

Figure 1:
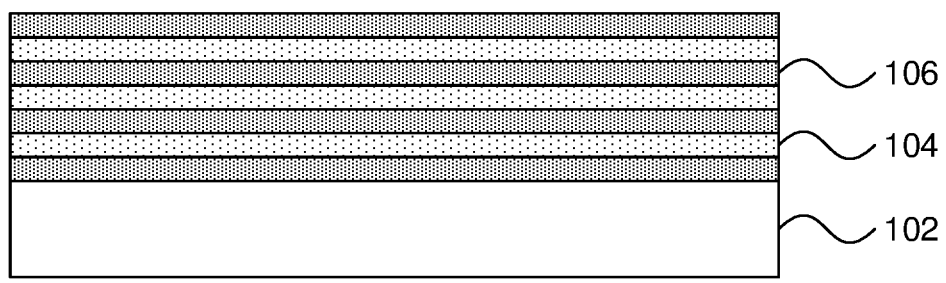
FIG. 1 is a cross-sectional view of a step in the formation of a nanosheet field effect transistor (FET) that shows a stack of alternating channel and sacrificial layers in accordance with an embodiment of the present principles.

Referring now to the drawings in which like numerals represent the same or similar elements and initially to FIG. 1, a step in the formation of a FET is shown. A semiconductor substrate 102 is layered with alternating layers of channel material 104 and sacrificial material 106. The semiconductor substrate 102 may be a bulk-semiconductor substrate. It should be understood that the stack of channel layers 104 and sacrificial layers 106 can be sectioned into device regions, although only one such device region is shown herein. It is specifically contemplated that the alternating layers of channel material 104 and sacrificial material 106 are formed as sheets of material. It should be understood that, although nanosheet structures are handled specifically herein, the present embodiments may be applied to create nanowire or other structures as well.

In one specific embodiment, it is contemplated that the layers of channel material 104 may have a thickness between about 5 nm and about 10 nm and that the layers of sacrificial material 106 may have a thickness between about 5 nm and about 10 nm. As used herein, the term "nanosheet" refers to a structure that has a ratio of its cross-sectional width to its cross-sectional height greater than about 2:1, whereas the term "nanowire" refers to a structure that has a ratio of its cross-sectional width to its cross-sectional height less than about 2:1.

In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

It is specifically contemplated that the alternating layers 104 and 106 are formed from different materials. In one particular embodiment, the layers of channel material 104 may be formed from, e.g., germanium or a germanium-containing semiconductor, and the layers of sacrificial material may be formed from a material having high etch selectivity with respect to the channel material, such as gallium arsenide. Gallium arsenide has the same lattice constant as germanium, making it particularly useful in embodiments that form the layers by epitaxial growth, but it should be understood that any appropriate material may be used instead. For example, silicon germanium with a high germanium concentration (e.g., greater than about 50% but less than about 80%) may be used instead of gallium arsenide. In one particular embodiment, the layers of channel material 104 may be about 9 nm thick and the layers of sacrificial material may be about 12 nm thick, but it should be understood that other thicknesses may be used in accordance with design needs and fabrication process limitations.

The layers of channel material and sacrificial material 104 and 106 may be formed on the substrate 102 by any appropriate deposition process. For example, the alternating layers may be formed by alternating deposition processes including, e.g., chemical vapor deposition (CVD), physical vapor deposition (PVD), atomic layer deposition (ALD), or gas cluster ion beam (GCIB) deposition. The alternating layers may alternately be formed by epitaxial growth, with each successive layer being grown from the surface of the last. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
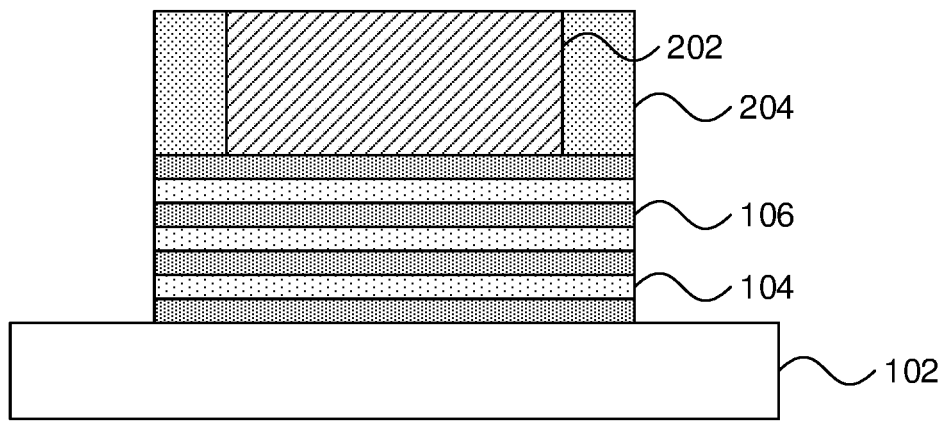
FIG. 2 is a cross-sectional view of a step in the formation of a nanosheet FET that shows the formation of a dummy gate and patterning of the stack in accordance with an embodiment of the present principles.

Referring now to FIG. 2, a step in the formation of a FET is shown. A dummy gate 202 or other sacrificial structure is formed over the stack of alternating layers. It is specifically contemplated that the dummy gate 202 may be formed from any material that is selectively etchable with respect to the channel material and the sacrificial material such as, e.g., polymorphous silicon or amorphous silicon. The dummy gate 202 may be formed with a dummy oxide layer (not shown) that protects the channel layers 104 when the dummy gate 202 is subsequently removed. The dummy gate 202 may be formed by depositing a layer of dummy gate material and then patterning the dummy gate material. Dummy gate sidewalls 204 may be formed from, e.g., a hardmask material such as silicon nitride using a conformal deposition followed by an anisotropic etch that removes the hardmask material from horizontal surfaces. Although silicon nitride is specifically contemplated, it should be understood that other materials may be used instead, such as silicoboron carbonitride, silicon carboxide, and silicon oxynitride.

After formation of the dummy gate 202, the stack of alternating layers is etched down in regions not covered by the dummy gate 202 and sidewalls 204. This etch can be performed using an anisotropic etch such as reactive ion etching (RIE). The etch can be performed in a single etch that removes material from both the channel layers 104 and the sacrificial layers 106 or may, alternatively, be performed using alternating etching processes that selectively affect the channel layers 104 and the sacrificial layers 106 in turn. As used herein, the term "selective" in reference to a material removal process denotes that the rate of material removal for a first material is greater than the rate of removal for at least another material of the structure to which the material removal process is being applied.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
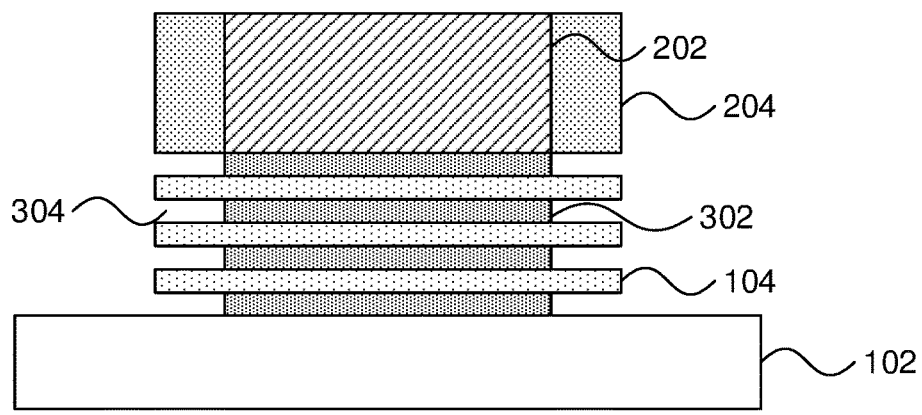
FIG. 3 is a cross-sectional view of a step in the formation of a nanosheet FET that shows recessing the sacrificial layers relative to the channel layers in accordance with an embodiment of the present principles.

Referring now to FIG. 3, a step in the formation of a FET is shown. The layers of sacrificial material 106 are etched back relative to the layers of channel material 104 using a selective isotropic etch such as a wet or dry chemical etch. The etch produces recesses 304 that may in one particular embodiment be about 6 nm deep.

Figure 4:
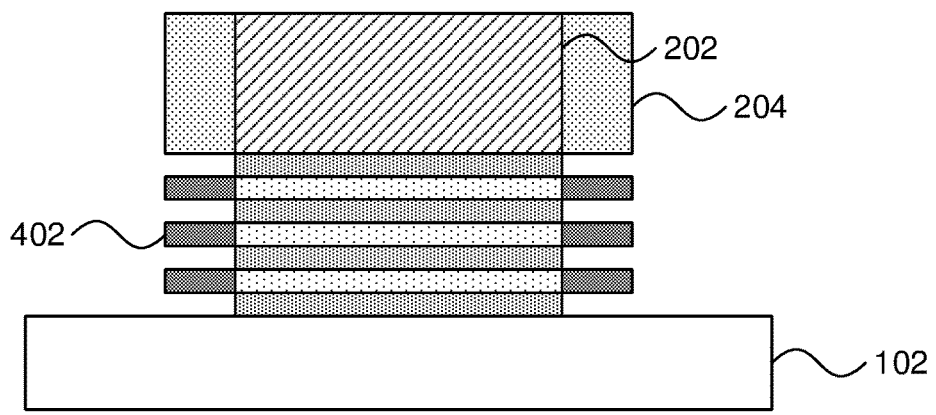
FIG. 4 is a cross-sectional view of a step in the formation of a nanosheet FET that shows forming doped channel extensions at the ends of the channel layers in accordance with an embodiment of the present principles.

Referring now to FIG. 4, a step in the formation of a FET is shown. Extension layers 402 are formed in the exposed channels 104 by, e.g., tilted ion implantation, monolayer doping, or plasma doping. Any appropriate dopant may be used, with boron and gallium being specifically contemplated for germanium-based pFETs. The dopants reduce electrical resistance between the channel layers and the subsequently formed source/drain structures.

Figure 5:
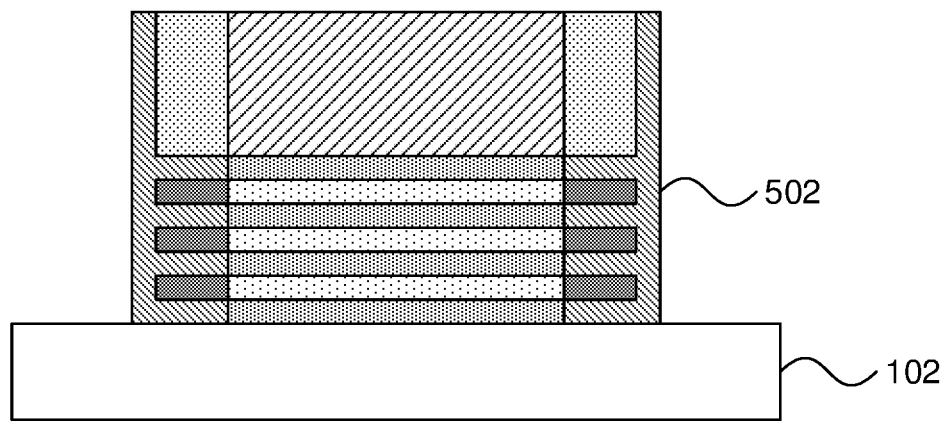
FIG. 5 is a cross-sectional view of a step in the formation of a nanosheet FET that shows the formation of a metal-doped insulator layer in accordance with an embodiment of the present principles.

Referring now to FIG. 5, a step in the formation of a FET is shown. A metal-doped insulator material 502 is deposited over the exposed surfaces using, e.g., ALD or any other appropriate conformal deposition process. It is specifically contemplated that the metal-doped insulator material may be formed from germanium dioxide that is doped with an appropriate metal species such as, e.g., yttrium, hafnium, lanthanum, aluminum, scandium, etc. These metals stabilize the germanium dioxide and improve its water resistance. The resulting metal-doped insulator material 502 may have an exemplary concentration of metal dopants of between about 5% and about 30%.

Figure 6:
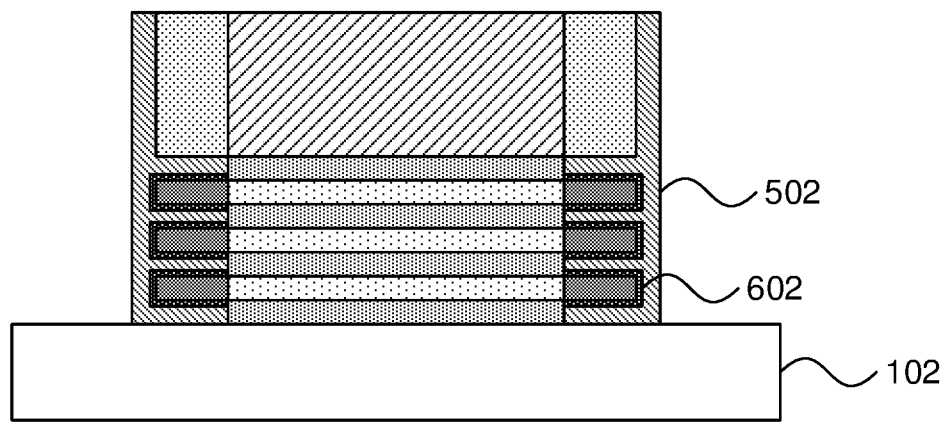
FIG. 6 is a cross-sectional view of a step in the formation of a nanosheet FET that shows the formation of a metallic interface by annealing in accordance with an embodiment of the present principles.

Referring now to FIG. 6, a step in the formation of a FET is shown. In an embodiment that uses metal-doped germanium dioxide in the insulator layer 502, an anneal is performed that causes the germanium dioxide at the channel interface to react with the pure germanium there, producing germanium monoxide at the interface. The volatile germanium monoxide desorbs, causing the interface between the doped extensions 402 and the metal-doped insulator layer 502 to form a metallic layer 602 (e.g., a germanide). The anneal may be performed with a temperature between about 500° C. and about 800° C. in a nitrogen ambient environment. The reaction occurs only at the interface, leaving the remaining portions of the metal-doped insulator layer 502 unaffected.

Figure 7:
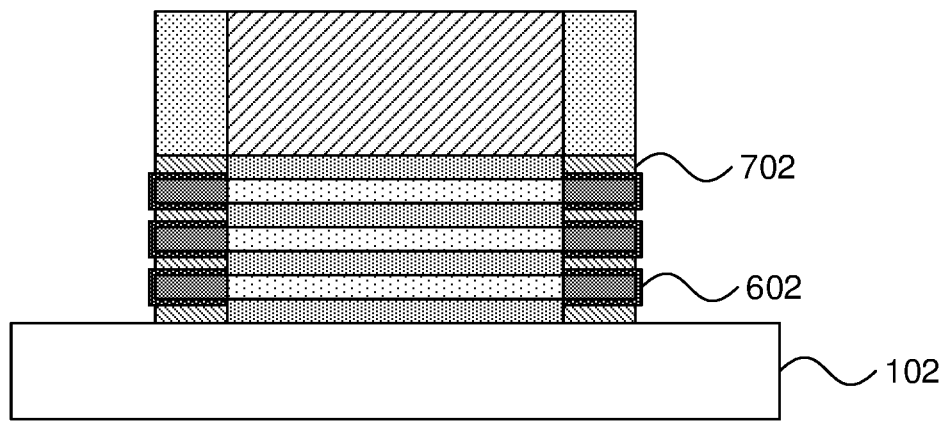
FIG. 7 is a cross-sectional view of a step in the formation of a nanosheet FET that shows etching back the metal-doped insulator layer to expose the metallic interface in accordance with an embodiment of the present principles.

Referring now to FIG. 7, a step in the formation of a FET is shown. The remaining metal-doped insulator material is etched back to form inner spacers 702, exposing the metallic layer 602. The etch may be a timed wet or dry chemical etch that employs, e.g., dilute hydrofluoric acid or hydrochloric acid.

Figure 8:
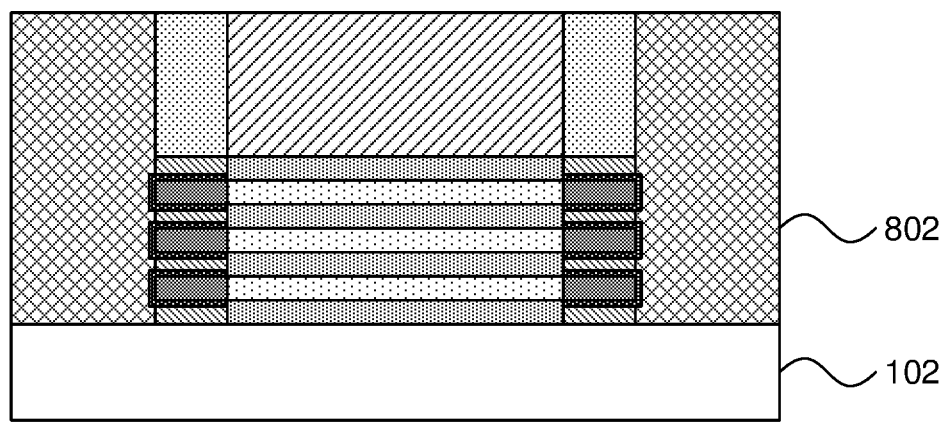
FIG. 8 is a cross-sectional view of a step in the formation of a nanosheet FET that shows the formation of metal source/drain regions in accordance with an embodiment of the present principles.

Referring now to FIG. 8, a step in the formation of a FET is shown. Metal source and drain structures 802 are deposited around the structures, in particular contacting the metallic layer 602. The metal source/drain structures 802 may be deposited by any appropriate deposition process including, e.g., CVD, ALD, or PVD. The metal source/drain structures 802 make electrical contact with the metallic layer 602 and, thereby, with the channel extensions 402.

Figure 9:
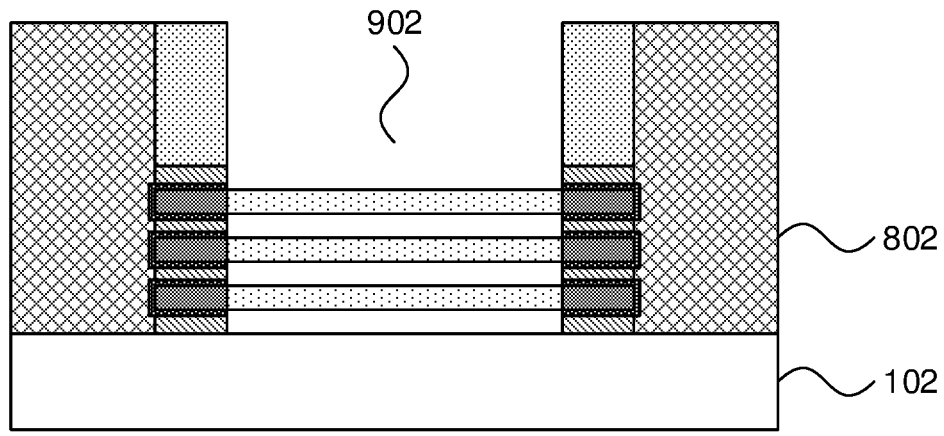
FIG. 9 is a cross-sectional view of a step in the formation of a nanosheet FET that shows the removal of the dummy gate and sacrificial layers in accordance with an embodiment of the present principles.

Referring now to FIG. 9, a step in the formation of a FET is shown. The dummy gate 202 is etched away, along with remaining sacrificial material 302. This etch exposes the horizontal surfaces of channel layers 104 in the gate region 902. It is specifically contemplated that a first isotropic or anisotropic etch may remove the dummy gate 202 to expose the underlying dummy oxide. The dummy oxide may then be removed and the recessed sacrificial material 302 may be etched away using any appropriate isotropic etch that removes material from between the channel layers 104.

Figure 10:
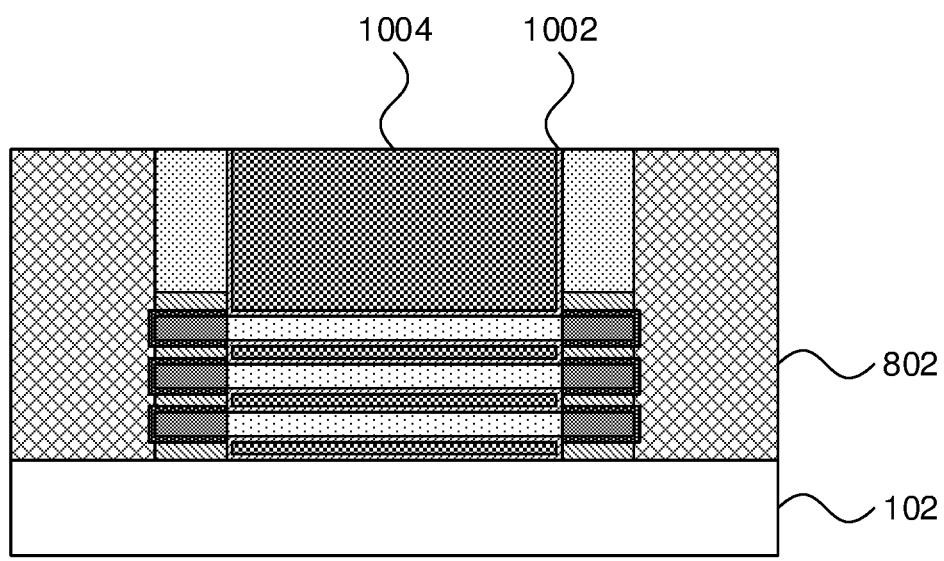
FIG. 10 is a cross-sectional view of a step in the formation of a nanosheet FET that shows the formation of a gate stack in accordance with an embodiment of the present principles.

Referring now to FIG. 10, a step in the formation of a FET is shown. A gate stack is deposited that includes a conformal deposition of a gate dielectric material 1002 followed by deposition of a gate conductor 1004. An interfacial layer (not shown) of germanium dioxide may be formed first over the channel layers 104 to reduce interface trap density between the channel and the gate dielectric. It is specifically contemplated that the interfacial layer may have a thickness between about 0.5 nm and about 1 nm. The gate dielectric 1002 may be formed by any appropriate conformal deposition process including, e.g., CVD or ALD and may include any appropriate dielectric material. The thermal budget of this replacement metal gate process is below about 550° C., making it possible to complete the process without damaging the metal source/drain regions 802.

It is specifically contemplated that the gate dielectric 1002 may be formed from a high-k dielectric material, which is defined as a material having a dielectric constant k that is greater than the dielectric constant of silicon dioxide. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum.

The gate conductor 1004 may be, for example, a metal or metallic conductive material including, e.g., tungsten, nickel, titanium, molybdenum, tantalum, copper, platinum, silver, gold, ruthenium, iridium, rhenium, rhodium, and alloys thereof. The gate conductor may alternatively include a doped semiconductor material such as, e.g., doped polysilicon. When a combination of conductive elements is employed, an optional diffusion barrier material such as tantalum nitride or tungsten nitride may be formed between the conductive materials.

Figure 11:
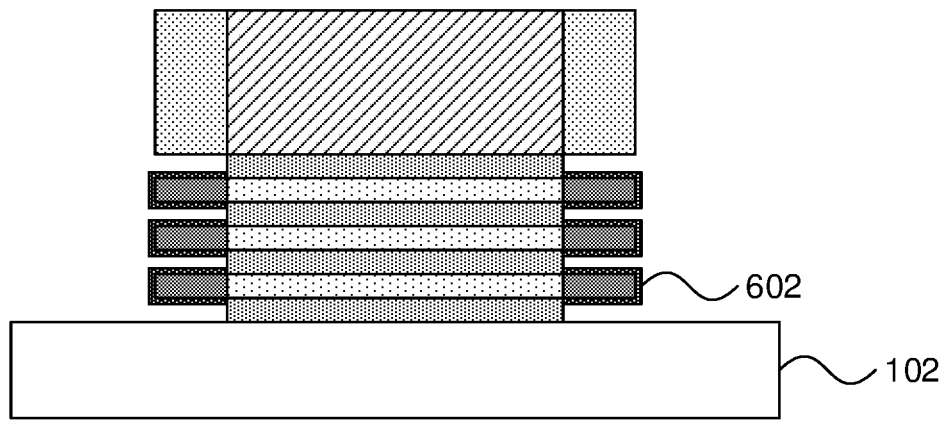
FIG. 11 is a cross-sectional view of an alternative step in the formation of a nanosheet FET that shows the removal of the metal-doped insulator layer in accordance with an embodiment of the present principles.

Referring now to FIG. 11, a step in forming an alternative embodiment of a FET is shown. Instead of keeping the metal-doped insulator layer 502 as inner spacers, this embodiment etches away the remaining metal-doped insulator material and replaces it with, for example, a low-k dielectric material. Thus, this step follows the step shown in FIG. 6, after the formation of the metallic regions 602. The metal-doped insulator layer 502 is etched away, leaving the sidewalls of the sacrificial layers 106 exposed.

Figure 12:
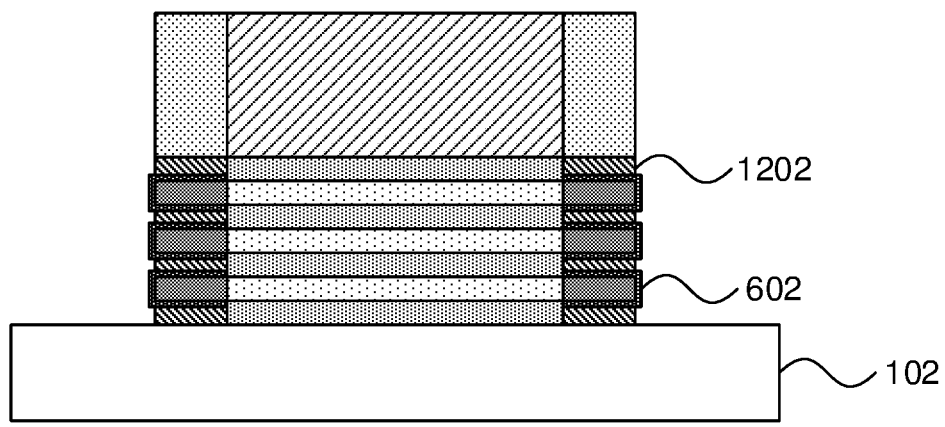
FIG. 12 is a cross-sectional view of an alternative step in the formation of a nanosheet FET that shows the formation of dielectric inner spacers in accordance with an embodiment of the present principles.

Referring now to FIG. 12, a step in forming an alternative embodiment of a FET is shown. New inner spacers 1202 are formed by depositing a dielectric material using a conformal deposition process that fills the spaces between metallic layers 602. The deposition may include any appropriate process such as, e.g., CVD or ALD. The dielectric material is then etched back to expose the side surfaces of the metallic layers 602 to form inner spacers 1202. The fabrication of the FET can then be finished as described above.

It is to be understood that aspects of the present invention will be described in terms of a given illustrative architecture;

however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well as any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 13:
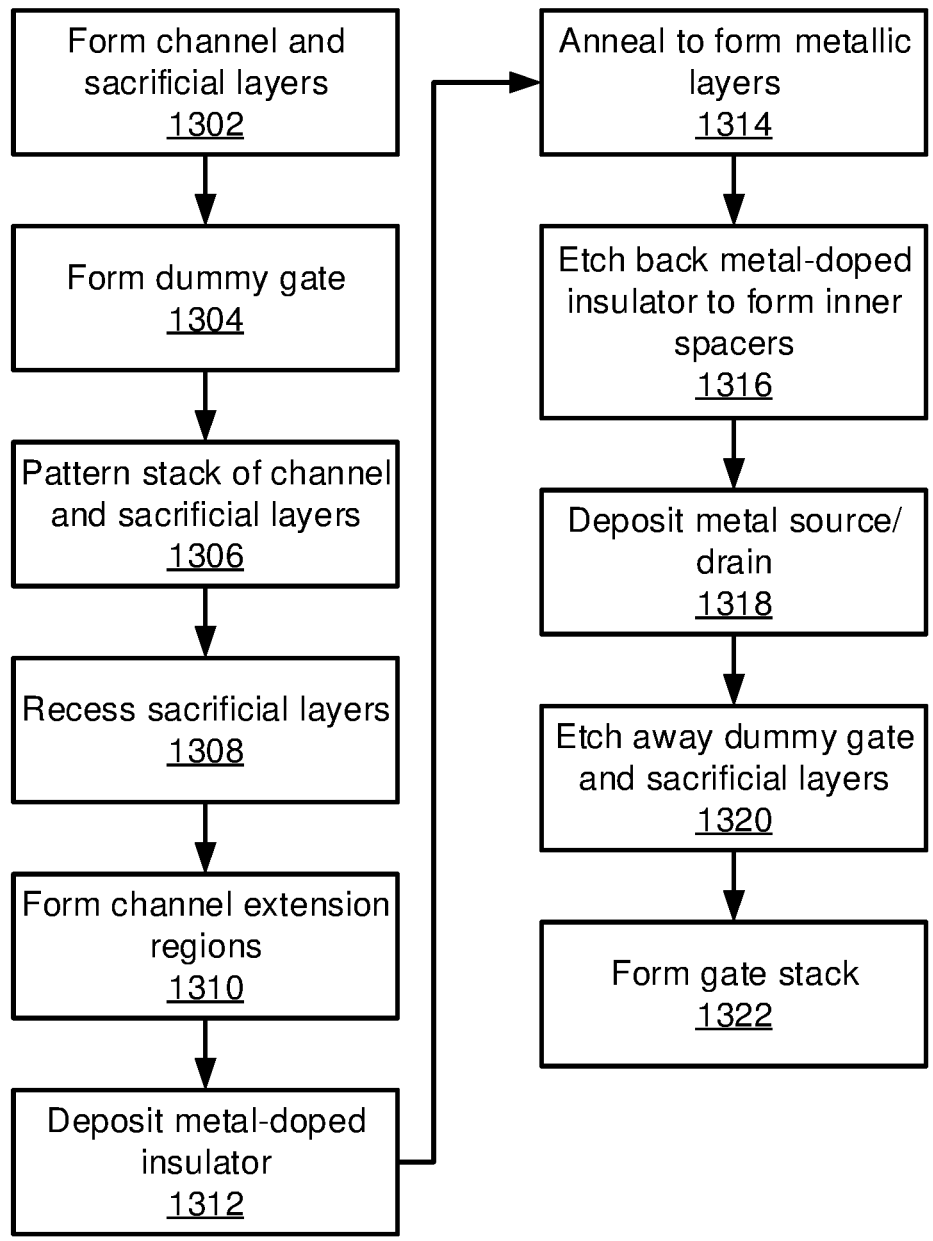
FIG. 13 is a block/flow diagram of a method of forming a nanosheet FET that uses metal-doped insulator material for inner spacers in accordance with an embodiment of the present principles.

Referring now to FIG. 13, a method of fabricating a FET is shown. Block 1302 forms the channel layers 104 and sacrificial layers 106 on a semiconductor substrate 102. As noted above, it is specifically contemplated that the channel layers may be formed from substantially pure germanium, while the sacrificial layers may be formed from gallium arsenide. Although the present embodiments specifically provide that the successive channel and sacrificial layers may be epitaxially grown, it should be understood that other deposition processes are also contemplated.

Block 1304 forms the dummy gate 202 on the stack of layers, with dummy gate sidewalls 204 being formed on its vertical surfaces. It is specifically contemplated that dummy gate material (such as, e.g., polysilicon or amorphous silicon) may be deposited and then patterned to define the device region by forming the dummy gate 202 on a dummy gate oxide (not shown). The dummy gate sidewalls 204 may then be formed by conformally forming a layer of hardmask material, such as silicon nitride, silicoboron carbonitride, or silicon carboxide, and then anisotropically etching such material away from horizontal surfaces using, e.g., a reactive ion etch. Block 1306 then patterns the stack of channel layers 104 and sacrificial layers 106 using the dummy gate 202 and sidewalls 204 as a mask.

Block 1308 recesses the sacrificial layers 106 relative to the channel layers 104 using an isotropic etch such as a timed wet or dry chemical etch. The etch is selective to the material of the sacrificial layers 106, removing a specified amount of the sacrificial material without damaging the channel layers 104. Block 1310 dopes the exposed ends of the channel layers 104 to form channel extension regions 402. Block 1310 may employ, e.g., a tilted ion implantation, monolayer doping, or plasma doping and the dopant species may include, e.g., boron or gallium for a pFET using a germanium channel material.

Block 1312 deposits a metal-doped insulator layer 502 by any appropriate conformal process such as, e.g., ALD. The metal-doped insulator may be formed from, e.g., germanium oxide doped with any appropriate metal species. Block 1314 then performs an anneal to form metallic layers 602 and block 1316 etches back the remaining metal-doped insulator layer 502 to form inner spacers 702.

Block 1318 deposits metal source/drain regions 802 using any appropriate deposition process (e.g., CVD, ALD, PVD, etc.), making electrical contact between the metal source/drain regions and the metallic layers 602. Block 1320 then etches away the dummy gate 202 and the remaining sacrificial layers 106 using one or more isotropic etches that leave the channel layers 104 intact. Block 1322 then forms the gate stack from, e.g., an interface layer (not shown) on the channel layers 104, a gate dielectric 1002 on the interface layer, and a gate conductor 1004 on the gate dielectric, though it should be understood that additional layers may be present in the gate stack, such as one or more work function metal layers or additional dielectric layers.

Figure 14:
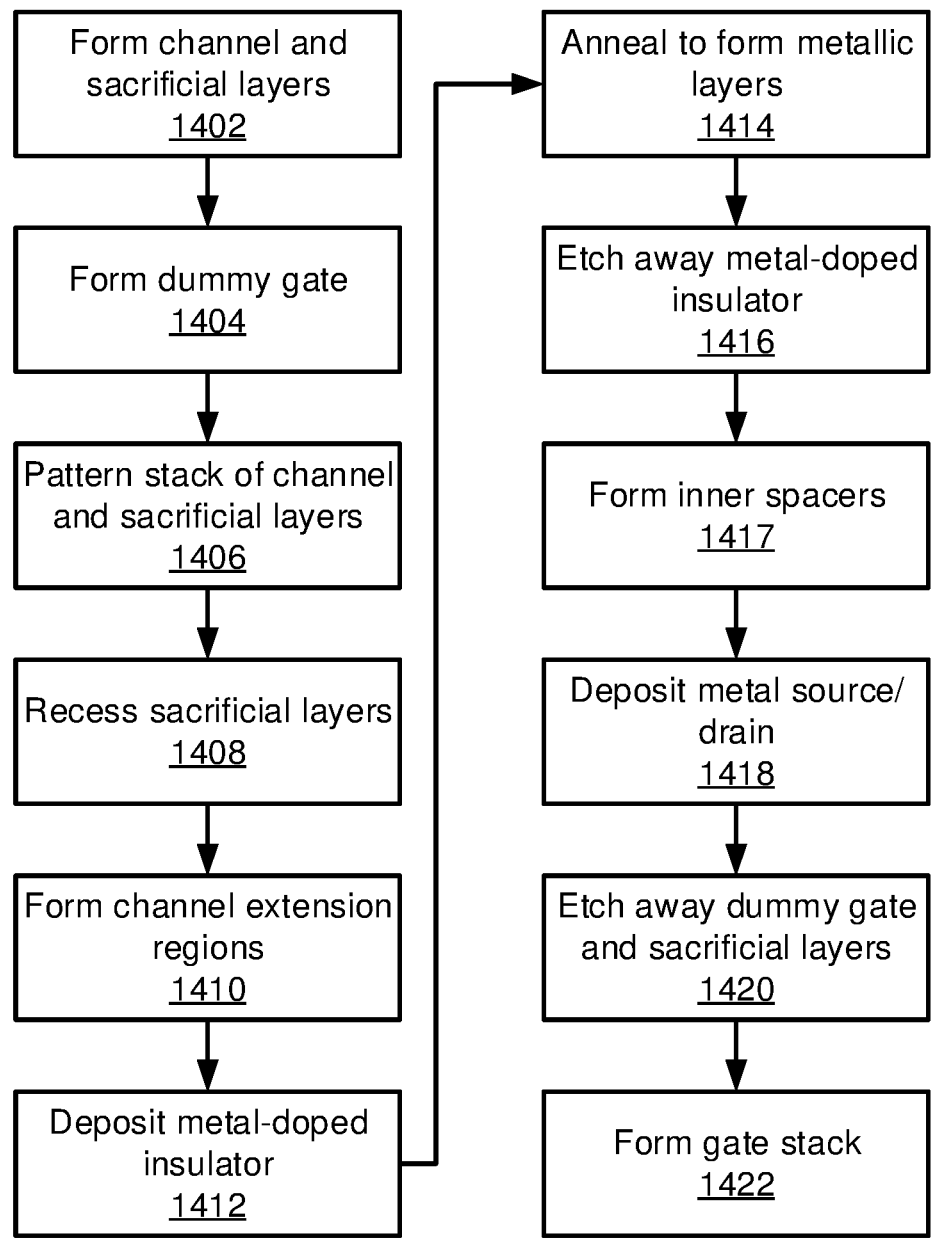
FIG. 14 is a block/flow diagram of a method of forming a nanosheet FET that replaces the metal-doped insulator material with another dielectric material to form inner spacers in accordance with an embodiment of the present principles.

Referring now to FIG. 14, an alternative method of fabricating a FET is shown. Block 1402 forms the channel layers 104 and sacrificial layers 106 on a semiconductor substrate 102. As noted above, it is specifically contemplated that the channel layers may be formed from substantially pure germanium, while the sacrificial layers may be formed from gallium arsenide. Although the present embodiments specifically provide that the successive channel and sacrificial layers may be epitaxially grown, it should be understood that other deposition processes are also contemplated.

Block 1404 forms the dummy gate 202 on the stack of layers, with dummy gate sidewalls 204 being formed on its vertical surfaces. It is specifically contemplated that dummy gate material (such as, e.g., polysilicon) may be deposited and then patterned to define the device region by forming the dummy gate 202. The dummy gate sidewalls 204 may then be formed by conformally forming a layer of hardmask material, such as silicon nitride, and then anisotropically etching such material away from horizontal surfaces using, e.g., a reactive ion etch. Block 1406 then patterns the stack of channel layers 104 and sacrificial layers 106 using the dummy gate 202 and sidewalls 204 as a mask.

Block 1408 recesses the sacrificial layers 106 relative to the channel layers 104 using an isotropic etch such as a timed wet or dry chemical etch. The etch is selective to the material of the sacrificial layers 106, removing a specified amount of the sacrificial material without damaging the channel layers 104. Block 1410 dopes the exposed ends of the channel layers 104 to form channel extension regions 402. Block 1410 may employ, e.g., a tilted ion implantation, monolayer doping, or plasma doping and the dopant species may include, e.g., boron or gallium for a pFET using a germanium channel material.

Block 1412 deposits a metal-doped insulator layer 502 by any appropriate conformal process such as, e.g., ALD. The metal-doped insulator may be formed from, e.g., germanium oxide doped with any appropriate metal species. Block 1414 then performs an anneal to form metallic layers 602 and block 1416 etches away the remaining metal-doped insulator layer 502. Block 1417 then deposits a layer of dielectric material to form inner spacers 1202.

Block 1418 deposits metal source/drain regions 802 using any appropriate deposition process (e.g., CVD, ALD, PVD, etc.), making electrical contact between the metal source/drain regions and the metallic layers 602. Block 1420 then etches away the dummy gate 202 and the remaining sacrificial layers 106 using one or more isotropic etches that leave the channel layers 104 intact. Block 1422 then forms the gate stack from, e.g., an interface layer (not shown) on the channel layers 104, a gate dielectric 1002 on the interface layer, and a gate conductor 1004 on the gate dielectric, though it should be understood that additional layers may be present in the gate stack, such as one or more work function metal layers or additional dielectric layers.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:

forming a stack of alternating channel layers and sacrificial layers;

recessing the sacrificial layers relative to the channel layers;

depositing a metal-doped insulator layer in contact with sidewalls of the channel layers;

annealing the metal-doped insulator layer to form a metallic layer at an interface between the metal-doped insulator layer and the channel layers;

etching back the metal-doped insulator layer to form inner spacers;

forming source/drain regions in contact with the metallic layer;

etching away the sacrificial layers; and forming a gate stack on and around the channel layers.

2. The method of claim 1, wherein the channel layers are formed from germanium and the metal-doped insulator layer is formed from metal-doped germanium oxide.

3. The method of claim 2, wherein the sacrificial layers are formed from gallium arsenide.

4. The method of claim 1, wherein the source/drain regions are formed from a metal.

5. The method of claim 1, further comprising doping exposed portions of the channel layers after recessing the sacrificial layers.

6. The method of claim 5, wherein doping the exposed portions comprises a process selected from the group consisting of tilted ion implantation, monolayer doping, and plasma doping.

7. The method of claim 1, further comprising:
depositing a dummy gate on the stack of alternating channel layers and sacrificial layers before recessing the sacrificial layers; and
etching away the dummy gate after forming the source/drain regions and before etching away the sacrificial layers.

8. A method for forming a semiconductor device, comprising:
forming a stack of alternating channel layers and sacrificial layers;
recessing the sacrificial layers relative to the channel layers;
depositing a metal-doped insulator layer in contact with sidewalls of the channel layers;
annealing the metal-doped insulator layer to form a metallic layer at an interface between the metal-doped insulator layer and the channel layers;
etching away the metal-doped insulator layer;
depositing a dielectric material after etching away the metal-doped insulator layer to form inner spacers;
forming source/drain regions in contact with the metallic layer;
etching away the sacrificial layers; and
forming a gate stack on and around the channel layers.

9. The method of claim 8, wherein the channel layers are formed from germanium and the metal-doped insulator layer is formed from metal-doped germanium oxide.

10. The method of claim 9, wherein the sacrificial layers are formed from gallium arsenide.

11. The method of claim 8, wherein the source/drain regions are formed from a metal.

12. The method of claim 8, further comprising doping exposed portions of the channel layers after recessing the sacrificial layers.

13. The method of claim 12, wherein doping the exposed portions comprises a process selected from the group consisting of tilted ion implantation, monolayer doping, and plasma doping.

14. The method of claim 8, further comprising:
depositing a dummy gate on the stack of alternating channel layers and sacrificial layers before recessing the sacrificial layers; and
etching away the dummy gate after forming the source/drain regions and before etching away the sacrificial layers.

15. The method of claim 8, wherein the inner spacers are formed from a low-k dielectric.

* * * * *